(12) United States Patent
Katkar et al.

(10) Patent No.: US 9,331,043 B1
(45) Date of Patent: May 3, 2016

(54) LOCALIZED SEALING OF INTERCONNECT STRUCTURES IN SMALL GAPS

(71) Applicant: Invensas Corporation, San Jose, CA (US)

(72) Inventors: Rajesh Katkar, San Jose, CA (US); Cyprian Emeka Uzoh, San Jose, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/609,720

(22) Filed: Jan. 30, 2015

(51) Int. Cl.
| | | |
|---|---|---|
| *H01L 23/48* | (2006.01) | |
| *H01L 23/00* | (2006.01) | |
| *H01L 25/00* | (2006.01) | |
| *H01L 25/065* | (2006.01) | |
| *H01L 23/498* | (2006.01) | |
| *H01L 23/528* | (2006.01) | |
| *H01L 21/768* | (2006.01) | |

(52) U.S. Cl.
CPC .............. *H01L 24/24* (2013.01); *H01L 21/768* (2013.01); *H01L 23/49838* (2013.01); *H01L 23/528* (2013.01); *H01L 24/82* (2013.01); *H01L 25/0657* (2013.01); *H01L 25/50* (2013.01); *H01L 2224/24145* (2013.01); *H01L 2224/24225* (2013.01); *H01L 2224/8282* (2013.01); *H01L 2224/82108* (2013.01); *H01L 2924/2064* (2013.01)

(58) Field of Classification Search
CPC .............. H01L 24/24; H01L 21/76858; H01L 21/76864; H01L 23/49838; H01L 23/528; H01L 23/5328; H01L 25/0657; H01L 25/50
USPC .................................................. 257/773, 777
See application file for complete search history.

(56) References Cited

U.S. PATENT DOCUMENTS

| | | | |
|---|---|---|---|
| 7,799,607 B2 | 9/2010 | Karashima et al. | |
| 8,466,488 B2 * | 6/2013 | Tischler | .................. H01L 33/62 257/13 |

OTHER PUBLICATIONS

Liu, Dr. Mary and Yin, Dr. Wusheng, "Solder Joint Encapsulant Adhesive—LGA High Reliability and Low Cost Assembly Solution," YINCAE Advanced Materials, LLC, White Paper, Apr. 2014.

* cited by examiner

*Primary Examiner* — Tu-Tu Ho (57) ABSTRACT

An apparatus relates generally to a microelectronic device. In such an apparatus, a first substrate has a first surface with first interconnects located on the first surface, and a second substrate has a second surface spaced apart from the first surface with a gap between the first surface and the second surface. Second interconnects are located on the second surface. Lower surfaces of the first interconnects and upper surfaces of the second interconnects are coupled to one another for electrical conductivity between the first substrate and the second substrate. A conductive collar is around sidewalls of the first and second interconnects, and a dielectric layer is around the conductive collar.

20 Claims, 9 Drawing Sheets

FIG. 8-2

LOCALIZED SEALING OF INTERCONNECT STRUCTURES IN SMALL GAPS

FIELD

The following description relates to microelectronic devices. More particularly, the following description relates to localized sealing of interconnect structures in small gaps for package-on-package or die-on-die microelectronic devices.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

Conventional interconnecting of an IC to another IC or to a circuit platform has issues with respect to completely coating interconnect structures in small gaps with an underfill layer. An incomplete protective coating may result in reliability problems, such as may be associated with corrosion of exposed surfaces of such interconnect structures.

Accordingly, it would be desirable and useful to provide for protective coating of interconnect structures in small gaps.

BRIEF SUMMARY

An apparatus relates generally to a microelectronic device. In such an apparatus, a first substrate has a first surface with first interconnects located on the first surface, and a second substrate has a second surface spaced apart from the first surface with a gap between the first surface and the second surface. Second interconnects are located on the second surface. Lower surfaces of the first interconnects and upper surfaces of the second interconnects are coupled to one another for electrical conductivity between the first substrate and the second substrate. A conductive collar is around sidewalls of the first and second interconnects, and a dielectric layer is around the conductive collar.

A method relates generally to forming a microelectronic device. A first layer of a first self-assembly matrix material with first conductive particles suspended therein is applied onto first sidewalls and lower surfaces of first interconnects. The first interconnects are on a first surface of a first substrate. A second layer of a second self-assembly matrix material with second conductive particles suspended therein is applied onto second sidewalls and upper surfaces of second interconnects. The second interconnects are on a second surface of a second substrate. A portion of the first layer is removed for temporarily exposing the lower surfaces of the first interconnects. A portion of the second layer is removed for temporarily exposing the upper surfaces of the second interconnects. The first conductive particles are phase separated from the first self-assembly matrix material and the second conductive particles from the second self-assembly matrix material for providing a conductive collar around sidewalls of the first and second interconnects and a dielectric layer around the conductive collar. The second surface is spaced apart from the first surface with approximately a 5 or less micron gap therebetween for the first and second interconnects diffusion bonded to one another.

Another method relates generally to forming a microelectronic device. In such a method, a first layer of a first self-assembly matrix material with first conductive particles suspended therein is applied onto first sidewalls and lower surfaces of first interconnects. The first interconnects are on a first surface of a first substrate. A second layer of a second self-assembly matrix material with second conductive particles suspended therein is applied onto second sidewalls and upper surfaces of second interconnects. The second interconnects are on a second surface of a second substrate. The first layer on the lower surfaces and the second layer on the upper surfaces are put proximal to or in contact with one another. The first conductive particles are phase separated from the first self-assembly matrix material and the second conductive particles are phase separated from the second self-assembly matrix material for providing: a conductive collar around sidewalls of the first and second interconnects, a bonding layer between the lower surfaces of the first interconnects and the upper surfaces of the second interconnects, and a dielectric layer around the conductive collar. The second surface is spaced apart from the first surface with approximately a 5 or less micron gap therebetween for the first and second interconnects intermetallic bonded to one another.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 6-1 and 6-2 are a hybrid flow-block diagram depicting an exemplary process flow for formation of the microelectronic devices of FIGS. 2 through 5.

FIG. 6-3, in combination with FIG. 6-1, is a hybrid flow-block diagram depicting another exemplary process flow for formation of the microelectronic devices of FIGS. 2 through 5.

FIGS. 8-1 and 8-2 are a hybrid flow-block diagram depicting yet another exemplary process flow for formation of the microelectronic devices of FIGS. 2 through 5.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1:
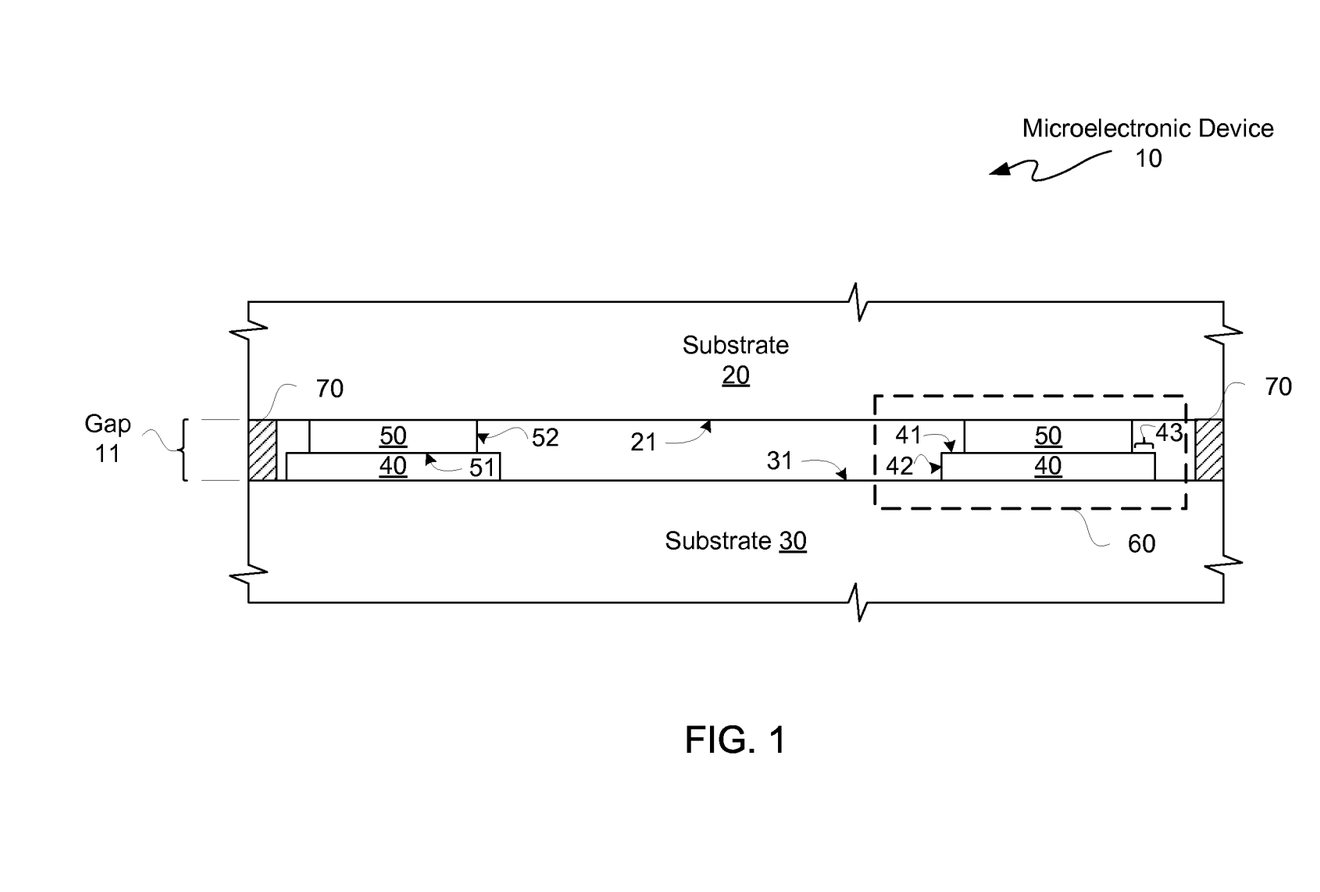
FIG. 1 is a block diagram of a side view depicting an exemplary conventional microelectronic device.

FIG. 1 is a block diagram of a side view depicting an exemplary conventional microelectronic device 10. Microelectronic device 10 includes a first substrate 20 and a second substrate 30. Substrate 20 may have a backside or front side surface ("upper surface") 21, and substrate 30 may have a backside or front side surface ("lower surface") 31.

Such upper and lower designation with respect to surfaces 21 and 31 is for the orientation illustratively depicted. Along those lines, such upper and lower designations as used herein are for clarity in referring to an orientation illustratively depicted; however, as shall be apparent from the following description, a reverse, side or other orientation may be used.

Surfaces 21 and 31 may be facing one another defining a gap 11 between such surfaces. This gap 11 is small, namely gap 11 may conventionally be approximately 5 or less microns in height.

Interconnects 50 may be located on upper surface 21, and interconnects 40 may be located on lower surface 31. By having interconnects "on" a surface, it is meant to include both direct contact and/or indirect contact with such a surface, where the latter may include one or more intervening layers between an interconnect and an associated surface.

Substrates 20 and 30 may be respective circuit platforms, which may include respective semiconductor wafers such as in wafer-level-packaging ("WLP"), an integrated circuit die, an interposer die ("interposer"), a printed board ("PB"), a printed wiring board ("PWB"), a printed circuit board ("PCB"), a printed wiring assembly ("PWA")/a printed circuit assembly ("PCA"), a package substrate, a chip carrier, and/or other form of substrate. However, generally substrates 20 and 30 are used for forming a die-on-die or package-on-package microelectronic device 10.

Again, surfaces 21 and 31 may be spaced apart from one another with approximately a 5 or less micron gap 11 between such surfaces. In some instances, such gap 11 may be approximately 2 microns or less. In other instances, such gap 11 may be between approximately 5 and 20 microns.

Conventionally, "lower" surfaces 51 of interconnects 50 and "upper" surfaces 41 of interconnects 40 are coupled to one another, including directly or indirectly coupled, for electrical conductivity between substrates 20 and 30. For purposes of clarity and not limitation, the designations upper and lower is with respect to surfaces of associated interconnects, and not the overall orientation with respect to microelectronic device 10.

Surface areas of upper surfaces 41 may optionally be larger than surface areas of corresponding lower surfaces 51. Furthermore, optionally, surface areas of lower surfaces 51 may be generally centered with respect to corresponding surface areas of upper surfaces 41. Along those lines, due to design tolerances and/or process variations, such surface areas may not be centered with respect to one another, but may be offset from one another by approximately 10 or less microns. In an implementation, optionally perimeter portions 43 of upper surfaces 41 may not be in contact with lower surfaces 51, though lower surfaces 51 may be above, but not over, such perimeter portions 43. Even though diameters or widths of interconnects 50 are illustratively depicted as being smaller than diameters or widths of interconnects 40, in other implementations such diameters or widths may be the same or diameters or widths of interconnects 50 may be larger than diameters or widths of interconnects 40.

Interconnects 40 and 50 may include one or more electrically conductive materials, such as for example one or more metal conductors. One or more of these materials may be subject to corrosion, oxidation, and/or other form of degradation of such electrical conductivity and/or reliability due to environmental conditions. Interconnects 40 and 50 may be any of a variety of under bump metalization ("UBM") structures, including ball limiting pads (i.e., shallow dish-like structures), conductive substrate pads, raised pads, recessed pads, and/or a combination thereof. Various types of interconnects may be used for interconnects 40 and 50, such as copper, aluminum, gold, silver, indium, gallium, nickel, tungsten, their respective alloys, a combination thereof, and/or other UBM structures. For purposes of clarity by way of example and not limitation, it shall be assumed that interconnects 40 and 50 are respective copper UBM structures for copper-to-copper bonding to form substrate-to-substrate conductive structures 60.

These copper-to-copper direct bonding conductive structures 60 may produce a short bump height gap 11, such as for example approximately a 1.8 micron tall gap 11. However, gap 11 may be so narrow as to preclude injection of an underfill layer 70 for sufficiently passivating and/or encapsulating interconnects 40 and 50.

Along those lines, an underfill layer 70 may not in some instances provide a sufficient cavity seal ring for hermetically sealing copper-to-copper bonds, which may decrease reliability of a microelectronic device 10. For example, portions of sidewalls 42 of interconnects 40 and/or portions of sidewalls 52 of interconnects 50 may be exposed to environmental corroders after injecting an underfill layer. Furthermore, non-overlapping portions of surfaces 41 and 51 with respect to one another may be exposed to environmental corroders after injecting an underfill layer 70. However, even if an injected underfill layer 70 does hermetically seal a cavity housing around conductive structures 60 formed of interconnects 40 and 50, such a seal ring may trap moisture, air, and/or other corroders inside such cavity, which may lead to reliability issues.

FIGS. 2 through 5 are respective block diagrams of cross-sectional side views depicting exemplary microelectronic devices 100. In each microelectronic device 100 of FIGS. 2 through 5, there is a collar 102 around sidewalls 42 and 52 respectively of interconnects 40 and 50 of conductive structures 160, and there is a dielectric layer 101, such as a resin layer 101, around collar 102 of conductive structures 160. Conductive structures 160 may be spaced apart from one another, namely having a pitch 161, which may be greater than, equal to, or less than width of gap 11. As there are some same elements between microelectronic devices 10 of FIG. 1 and microelectronic devices 100, description of such same elements is generally not repeated for purposes of clarity and not limitation.

Figure 2:
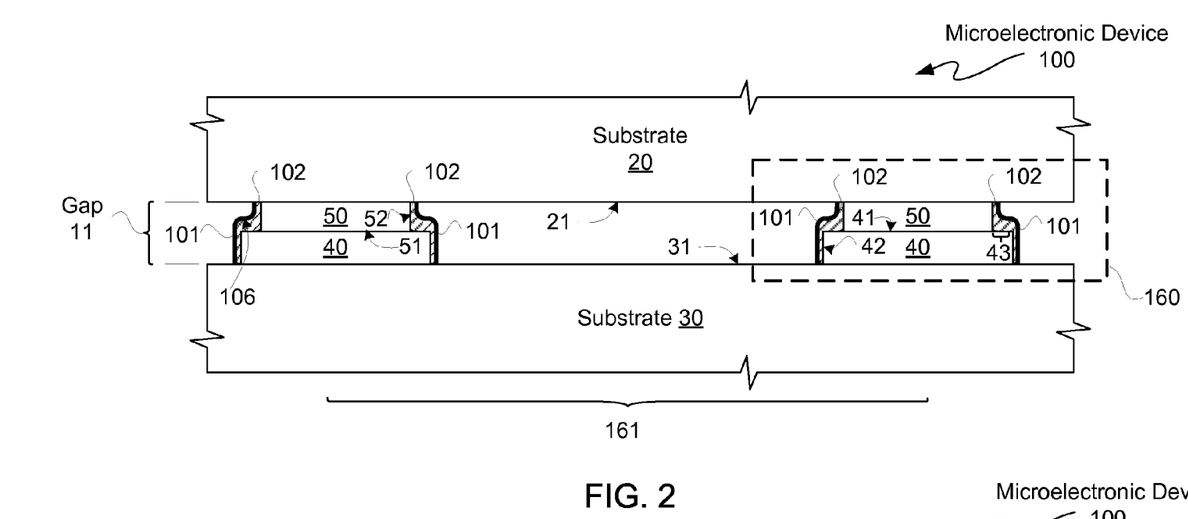
FIGS. 2 through 5 are respective block diagrams of cross-sectional side views depicting exemplary microelectronic devices.

With reference to FIG. 2, collar 102 may adhere to interconnects 40 and 50. More particularly, collar 102 may adhere to sidewalls or sidewall surfaces 42 and 52, as well as to perimeter portions 43, of interconnects 40 and 50. Optionally, collar 102 may adhere to other conductive surface components (not shown for purposes of clarity and not limitation) along surfaces 21 and 31 associated with conductive structures 160.

Resin layer 101 may adhere to an outer sidewall surface 106 of each collar 102 of which resin layer 101 is paired. Resin layer 101 may optionally adhere to surface components (not shown for purposes of clarity and not limitation) along surfaces 21 and 31 and/or to surfaces 21 and 31 associated with conductive structures 160. Adherence of resin layers 101 may be for hermetically sealing corresponding collars 102, as well as providing hermetic sealing of interconnects 40 and 50 of conductive structures 160 between surfaces 21 and 31.

Accordingly, rather than providing a conventional sealed cavity with an underfill layer 70, though such a conventional sealed cavity may optionally be added, each of conductive structures 160 may be hermetically sealed with a corresponding resin layer 101 in direct contact with a corresponding collar 102. Thus, trapping of moisture, air, and/or other corroders as with a conventional sealed cavity may be avoided.

Even if a conventional sealed cavity is optionally used with microelectronic device 100, each of conductive structures 160 may have an individual hermetic seal provided by corresponding resin layers 101. Thus, overall hermeticity of conductive structures 160 of a microelectronic device 100 may be increased. This may reduce likelihood of corrosion and may increase reliability.

Collar 102 may include a low-temperature intermetallic compound ("IMC"). Examples of low-temperature IMCs that may be used include Cu—Sn, Pb—Sn, and Cu—Al—Ni, among others. By "low-temperature" IMCs, it is generally meant IMCs that flow or reflow at temperatures associated with providing solder joints, such as generally at approximately 260 degrees Celsius and below. Thus, temperatures generally at most approximately 40 degrees Celsius above a liquidus temperature of an IMC may be used for such reflow.

Collars 102 may facilitate maintaining electrical conductivity between associated pairs of interconnects 40 and 50, as such an IMC of collars 102 may be formed on sidewalls 42 and 52 of such interconnects, and optionally may be on outer perimeter portions 43 of upper surfaces 51 of interconnects 50. Outer perimeter portions 43 may extend completely around intersecting sidewalls 52, and so collars 102 may further extend around outer perimeter portions 43 of upper surfaces 51 of interconnects 50.

Figure 3:
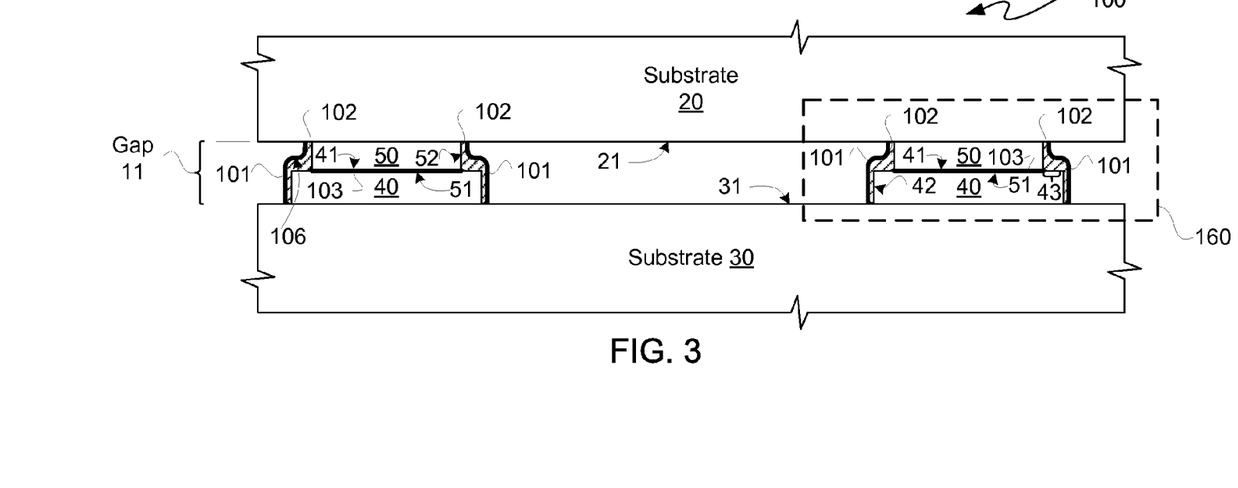

Microelectronic devices 100 of FIGS. 2 and 3 may be the same, except in microelectronic device 100 of FIG. 3 a diffusion bonding layer 103 may be formed between interconnects 40 and 50 for conductive structures 160. Lower surfaces 51 of interconnects 50 and upper surfaces 41 of interconnects 40 may be coupled to one another for electrical conductivity with diffusion bonding layers 103. In this implementation, interconnects 40 and 50 may generally appear as a unitary structure.

Figure 4:
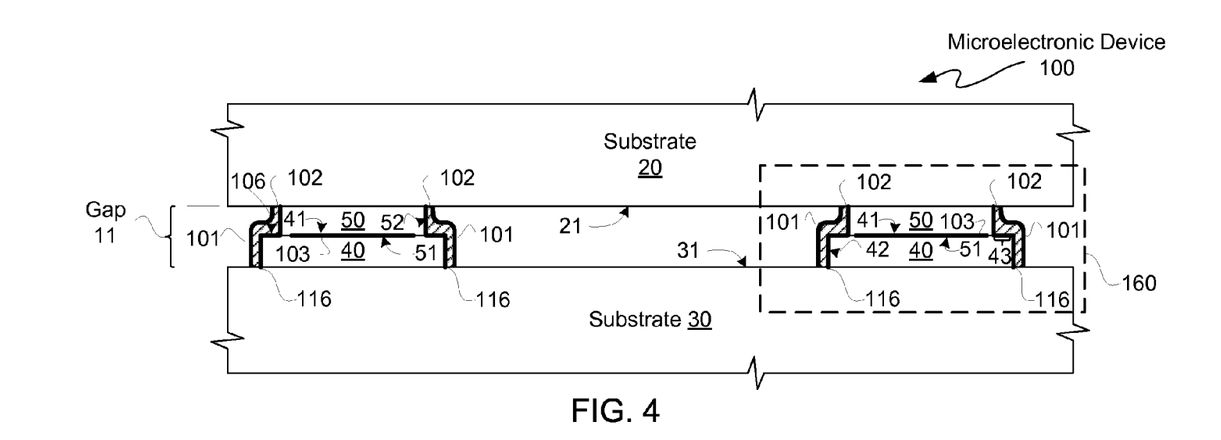

Microelectronic devices 100 of FIGS. 3 and 4 may be the same, except in microelectronic device 100 of FIG. 4 a diffusion barrier layer 116 may be formed.

With reference to FIG. 4, collars 102 may facilitate maintaining electrical conductivity between associated pairs of interconnects 40 and 50, as a metal or metallic compound of collars 102 may flow/reflow around and adhere to sidewalls 42 and 52 of such interconnects, and optionally may be on outer perimeter portions 43 of upper surfaces 51 of interconnects 50. However, such a metal may be a diffusor with respect to material or composition of either or both of interconnects 40 and 50, which diffusion may change resistivity of a conductive structure 160.

To mitigate against such diffusion of a metal of collar 102 into either or both of interconnects 40 and 50, diffusion barrier layers 116 may be formed along sidewalls 42 and 52, as well as on perimeter portions 43, of conductive structures 160. Generally, diffusion barrier layer 116 may be between interconnects 40 and 50 and collar 102 to mitigate against diffusion. For example, collar 102 may be predominantly Sn, and a predominantly Ni diffusion barrier layer 116 may be formed. In other implementations, this or another metal may be predominantly used for collar 102, and this or another other material may be predominantly used for diffusion barrier layer 116. By "predominantly," it is generally meant at least 50%.

Figure 5:
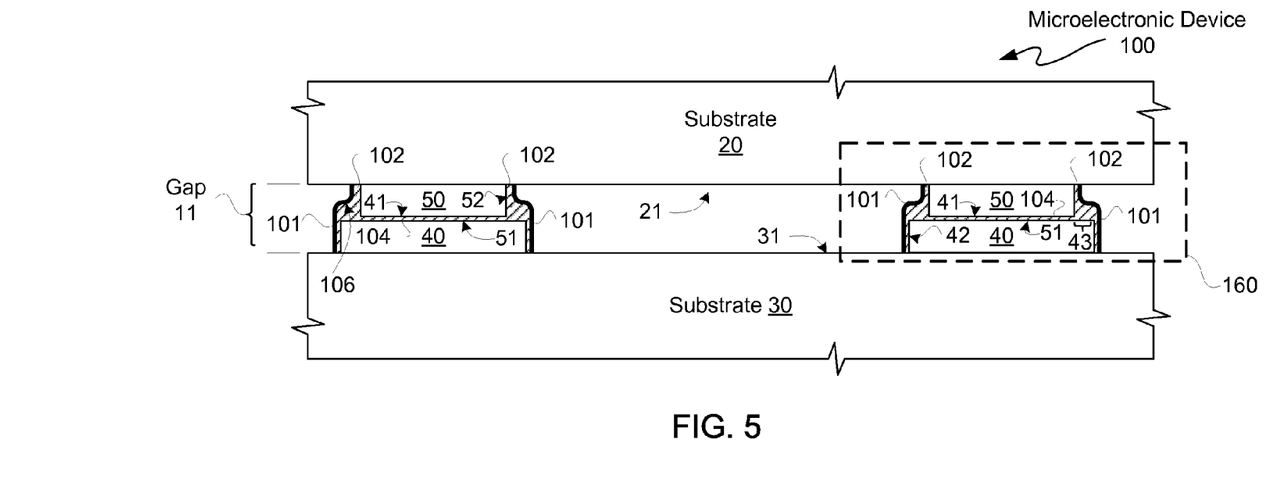

Microelectronic devices 100 of FIGS. 3 and 5 may be the same, except in microelectronic device 100 of FIG. 5 a diffusion bonding layer 103 in FIG. 3 is replaced with an intermetallic compound layer 104.

With reference to FIG. 5, collars 102 may facilitate maintaining electrical conductivity between associated pairs of interconnects 40 and 50, as a metal or metallic compound of collars 102 may flow/reflow around and adhere to sidewalls 42 and 52 of such interconnects, and optionally may be on outer perimeter portions 43 of upper surfaces 51 of interconnects 50. Additionally, during formation of collars 102, formation of corresponding intermetallic compound layers 104 may occur.

Intermetallic compound layers 104 may be formed between lower surfaces 51 and upper surfaces 41 of interconnects 50 and 40. Intermetallic compound layers 104 may be formed of the same material as collars 102. Along those lines, an intermetallic compound layer 104 and a corresponding collar 102 may be a unitary structure. Intermetallic compound layers 104 may couple lower surfaces 51 and opposing upper surfaces 41 of interconnects 50 and 40 to one another for electrical conductivity between substrates 20 and 30.

FIGS. 6-1 and 6-2 is a hybrid flow-block diagram depicting an exemplary process flow 140 for formation of microelectronic devices 100 of FIGS. 2 through 5. With simultaneous reference to FIGS. 1 through 6-2, process flow 140 is further described. Process flow 140 may be for wafer-level packaging ("WLP") using an in-process wafer 120 including substrate 20 and an in-process wafer 130 including substrate 30.

Figure 61:
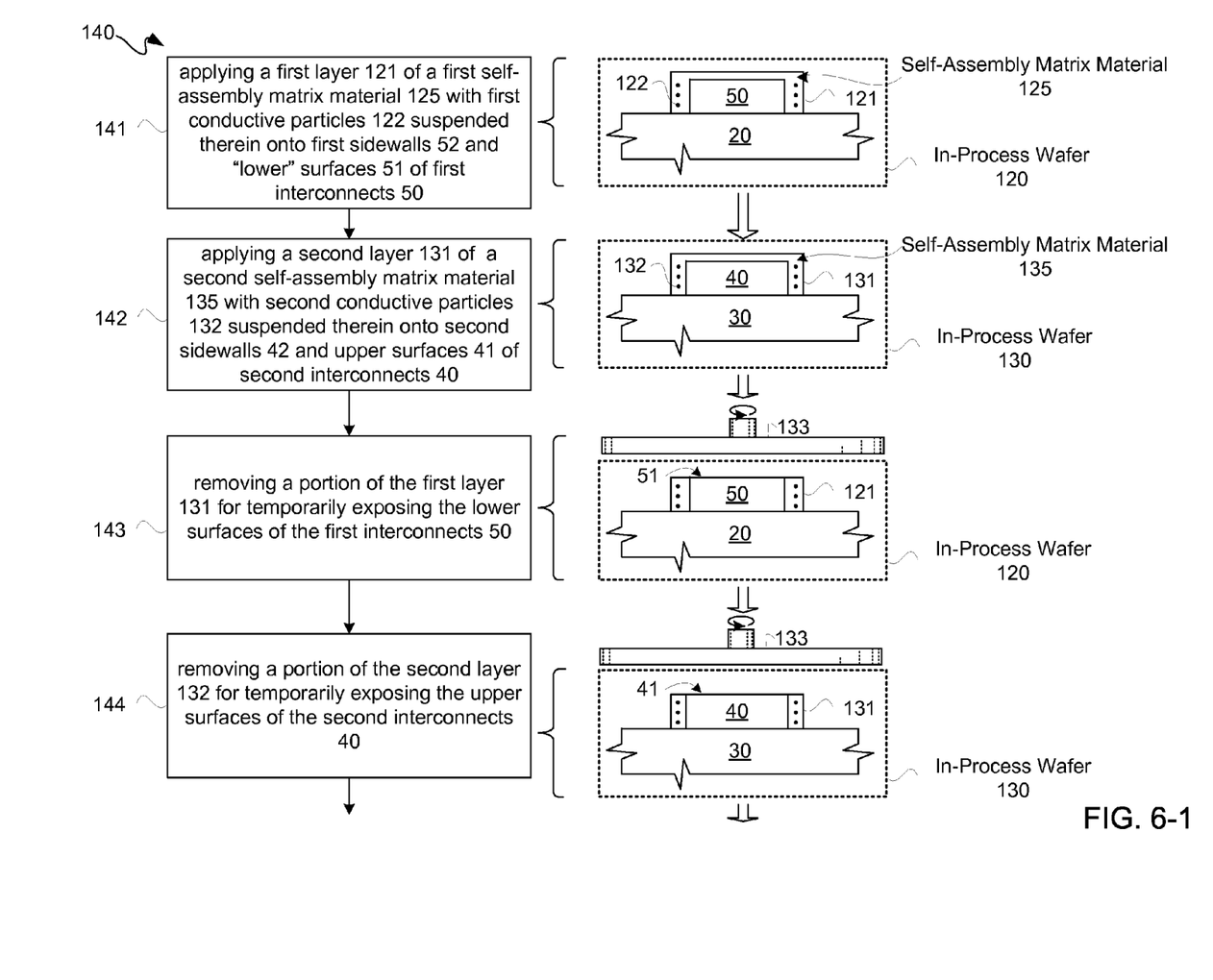
Figure 62:
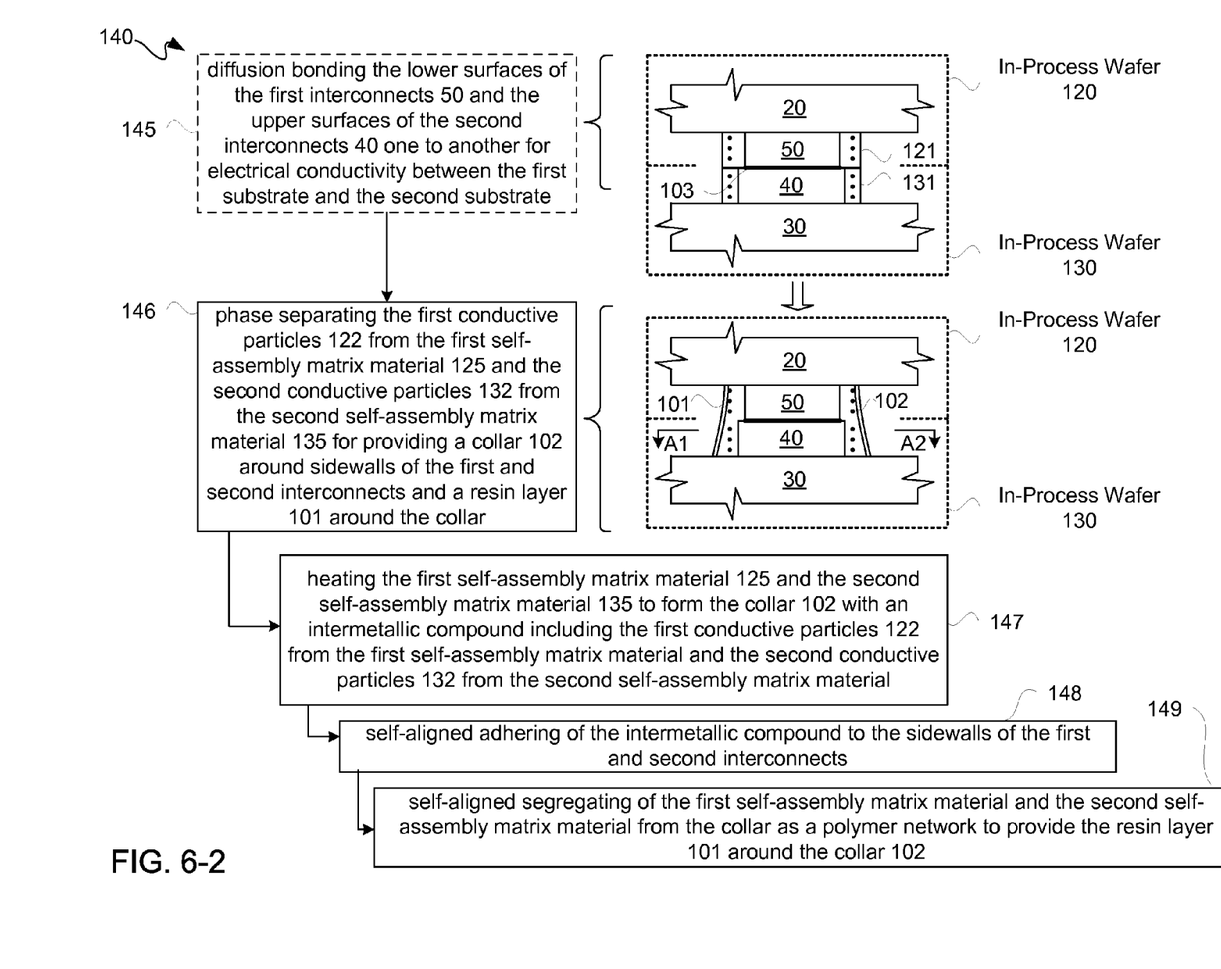

These wafers 120 and 130 may be coupled to one another as described herein to provide a package-on-package ("POP") microelectronic device 100. Between packages of such a POP microelectronic device 100, hermetically sealed interconnect conductive structures 160 may be formed using already formed interconnects 50 and 40 respectively on substrates 20 and 30 of such in-process wafers 120 and 130, as described herein.

At 141, a first layer 121 of a first self-assembly matrix material 125 with first conductive particles 122 suspended therein may be applied onto first sidewalls 52 and "lower" surfaces 51 of first interconnects 50. At 142, a second layer 131 of a second self-assembly matrix material 135 with second conductive particles 132 suspended therein may be applied onto second sidewalls 42 and upper surfaces 41 of second interconnects 40.

Self-assembly matrix materials 125 and 135 may be the same or different, such as same or different chemical compositions, of such materials. Examples of self-assembly matrix materials 125 and 135 include a solder joint encapsulatant adhesive, such as SMT256 or SMT266, or other suitable material.

Conductive particles 122 and 132 may be same or different mixes of same or different types of conductive particles. Such conductive particles 122 and/or 132 may include nanoparticles for self-assembly. For example, a combination of Sn particles and Cu, Ni, and/or In nanoparticles or alloys may be used. Generally, In particles may be used to form a strong bond at a low temperature as part of an IMC, and such a resulting IMC may have a high melting point. For purposes of clarity by way of example and not limitation, it shall be assumed that a CuSn, in particular a Cu3Sn IMC is formed, even though in other implementations other types of IMCs may be formed, including PbSn.

At 143, an upper portion of first layer 121 may be removed for temporarily exposing lower surfaces 51 of first interconnects 50. At 144, an upper portion of second layer 131 may be removed for temporarily exposing upper surfaces 41 of the second interconnects 40. Removal of such upper portions at 143 and 144 may be performed by respective planarizing operations 133 of in-process wafers 120 and 130. In this implementation, this planarizing or polishing may limit self-assembly matrix materials 125 and 135 to sidewalls 42 and 52 of interconnects 40 and 50, which for purposes of clarity and not limitation are assumed to be Cu bumps. However, other forms of interconnect structures and/or other materials may be used for interconnects 40 and 50.

In other implementations, outer layers 121 and 131 may be composed of electrolessly or electrolyticly deposited layers of materials. In one example, copper posts, such as interconnects 40 and 50, may be coated with a layer of nickel or nickel alloy, and such nickel or nickel alloy may be coated with tin or indium or their alloys. Unwanted materials at the tops of interconnects 40 and 50 may be removed for example by planarization or other polishing techniques prior to assembly.

At 145, lower surfaces 51 of first interconnects 50 and upper surfaces 41 of second interconnects 40 may optionally be diffusion bonded to one to another for electrical conductivity between substrate 20 and substrate 30. This diffusion bonding may form an optional diffusion bonding layer 103 between corresponding surface areas of surfaces 41 and 51. Such diffusion bonding, such as for Cu-to-Cu in this example, may be performed at low temperatures, namely at a temperature less than a reflow temperature of Sn, and this diffusion bonding may take place before phase separation at 146.

At 146, first conductive particles 122 may be phase separated from first self-assembly matrix material 125 and second conductive particles 132 may be phase separated from second self-assembly matrix material 135. This phase separation of self-assembly matrix materials 125 and 135 may result in a collar 102 and a resin layer 101. Along those lines, a collar 102 may form outwardly around sidewalls 42 and 52 of first and second interconnects 40 and 50, and a resin layer 101 may form outwardly around collar 102.

Phase separation at 146 may include an operation of heating at 147, as well as self-assembly or self-alignment operations at 148 and 149 resulting from heating of such self-assembly matrix materials 125 and 135. Heating at 147 of first self-assembly matrix material 125 and second self-assembly matrix material 135 may form collar 102 with an IMC, such as Cu3Sn in this example, where collar 102 includes first conductive particles 122 from first self-assembly matrix material 125 and second conductive particles 132 from second self-assembly matrix material 135 in such IMC. At 148, such IMC of collar 102 may adhere to sidewalls 42 and 52 of interconnects 40 and 50, as well as to perimeter portions 43 of upper surfaces 41. Generally, a thin and stable layer of Cu—Sn IMC may form on such sidewalls 42 and 52 to provide collar 102. Additionally, collar 102 may include formation of such IMC between interconnects 40 and 50. Along those lines, a portion of the copper of diffusion bonding layer 103 may be consumed in the formation of such IMC. Additionally, a portion of the copper associated with perimeter portions 43 may be consumed in the formation of such IMC. In an implementation, all Sn may be consumed in such formation of a Cu3Sn IMC collar 102. However, generally a Cu3Sn IMC may be formed for collar 102 adhering to and extending outwardly, such as radially, away from sidewalls 42 and 52.

Formation of collar 102 may promote self-aligned or self-assembled phase separation or segregation at 149. At 149, a polymer of first self-assembly matrix material 125 and a polymer of second self-assembly matrix material 135 used to suspend conductive particles may be segregated from collar 102, such as with formation of an IMC collar 102. Effectively, as collar 102 adheres to sidewalls 42 and 52 and forms as an IMC, polymers of self-assembly matrix materials 125 and 135 are pushed outwardly away from collar 102. These polymers may combine to forms a 3D polymer network to provide resin layer 101 outwardly around collar 102.

Resin layer 101, in addition to adhering to collar 102, may further adhere to surfaces of substrates 20 and 30, to hermetically seal conductive structures 160. Accordingly, as surfaces of substrates 20 and 30 may be spaced apart from one another with a less than approximately 5 micron gap therebetween due to conductive structures 160, resin layers 101 may provide hermetic seals for conductive structures 160 without having to apply an underfill layer.

FIG. 6-3, in combination with FIG. 6-1, is a hybrid flow-block diagram depicting another exemplary process flow 140 for formation of microelectronic devices 100 of FIGS. 2 through 5. With simultaneous reference to FIGS. 1 through 6-3, such other process flow 140 is further described. Again, process flow 140 may be for WLP using an in-process wafer 120 including substrate 20 and an in-process wafer 130 including substrate 30.

Figure 63:
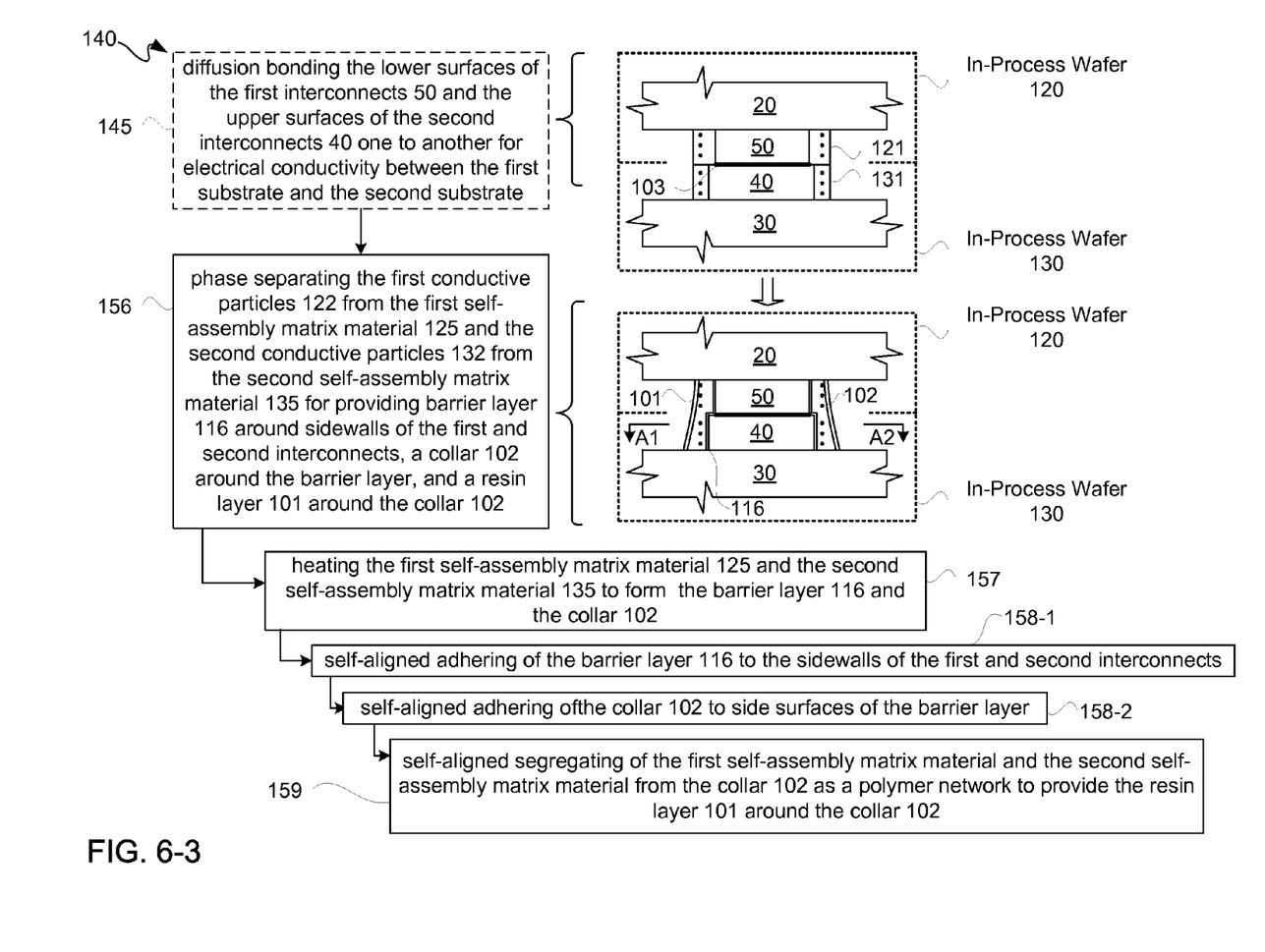

As much of the description of process flow 140 for FIGS. 6-1 and 6-3 is the same for process flow 140 of FIGS. 6-1 and 6-2, generally only the differences are described below for purposes of clarity and not limitation. Along those lines, operations 141 through 145 are as previously described and thus description of same is not repeated. However, in process flow 140 of FIG. 6-3, phase separation at 156 includes formation of a barrier layer 116. Such barrier layer 116 may be a diffusion barrier layer 116 with respect to one or more materials of collar 102.

At 156, first conductive particles 122 may be phase separated from first self-assembly matrix material 125 and second conductive particles 132 may be phase separated from second self-assembly matrix material 135. This phase separation of self-assembly matrix materials 125 and 135 may result in formation of a barrier layer 116, a collar 102 and a resin layer 101. Along those lines, a barrier layer 116 may form outwardly around sidewalls 42 and 52 of first and second interconnects 40 and 50. A collar 102 may form outwardly around barrier layer 116, and a resin layer 101 may form outwardly around collar 102.

Phase separation at 156 may include an operation of heating at 157, as well as self-assembly or self-alignment operations at 158-1, 158-2, and 159 resulting from heating of such self-assembly matrix materials 125 and 135. Heating at 157 of first self-assembly matrix material 125 and second self-assembly matrix material 135 may form barrier layer 116 and collar 102. In this example, barrier layer 116 may be an Ni barrier layer; however, in other implementations, other materials may be used for barrier layer 116, including for example copper alloys, nickel alloys, cobalt and cobalt alloys, Ti, Ta, Pd, TiN, TaN, tungsten and tungsten alloys.

Formation of barrier layer 116 may substantially limit any formation of collar 102 as an IMC, such as Cu3Sn in the previous example. Rather, in this example, first conductive particles 122 from first self-assembly matrix material 125 and second conductive particles 132 from second self-assembly matrix material 135 may include Ni and Sn. Thus, generally Ni conductive particles may form barrier layer 116, and Sn conductive particles may form collar 102, as Sn may generally be prevented from forming an IMC with Cu from interconnects 40 and 50 by diffusion barrier layer 116.

At 158-1, such diffusion barrier layer 116 may adhere to sidewalls 42 and 52 of interconnects 40 and 50, as well as to perimeter portions 43 of upper surfaces 41. Generally, in this example, a thin layer of Ni may form on such sidewalls 42 and 52 to provide diffusion barrier layer 116.

At 158-2, collar 102 may self-align to adhere to side surfaces of barrier layer 116. Generally, in this example, at 158-2, Sn may form outwardly on side surfaces of barrier layer 116 to provide collar 102 around barrier layer 116. Along those lines, a portion of the copper of interconnects 40 and 50 may be consumed prior to completion of the formation of barrier layer 116. Optionally, suspended conductive particles may be for forming both a barrier layer, as well as forming an IMC. Additionally, a portion of the copper associated with perimeter portions 43 may be consumed in the formation of such IMC.

In an implementation, generally collar 102 is formed of Sn adhering to and extending outwardly, such as radially for example, away from side surfaces of barrier layer 116. Self-aligned or self-assembled phase separation or segregation at 158-1 of barrier layer 116 may likewise promote self-aligned or self-assembled phase separation or segregation of collar 102 at 158-2.

Likewise, in an outwardly downstream effect, self-aligned or self-assembled phase separation or segregation formation of collar 102 at 158-2 may promote self-aligned or self-assembled phase separation or segregation at 159. At 159, a polymer of first self-assembly matrix material 125 and a polymer of second self-assembly matrix material 135 used to suspend conductive particles may be segregated with formation of collar 102. Effectively, as collar 102 adheres to barrier layer 116, polymers of self-assembly matrix materials 125 and 135 are pushed outwardly away from collar 102. These polymers may combine to form a 3D polymer network to provide resin layer 101 outwardly around collar 102.

Again, resin layer 101, in addition to adhering to collar 102, may further adhere to surfaces of substrates 20 and 30 to hermetically seal conductive structures 160. Accordingly, as surfaces of substrates 20 and 30 may be spaced apart from one another with a less than for example approximately a 5.0 micron gap therebetween due to conductive structures 160, resin layers 101 may provide hermetic seals for conductive structures 160 without having to apply an underfill layer.

Figure 7:
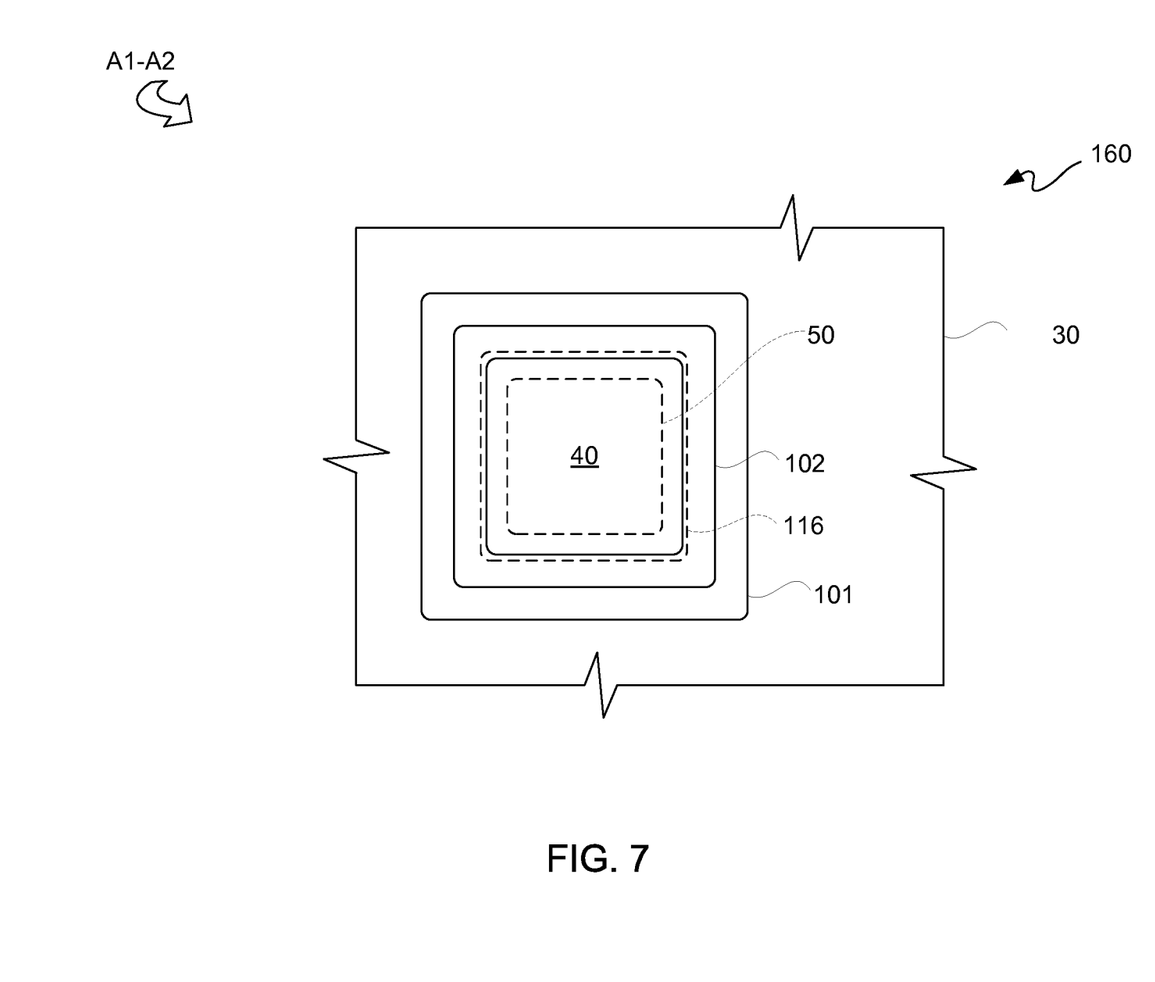
FIG. 7 is a cross-sectional view along A1-A2 of a conductive structure of FIG. 6-2 or 6-3.

FIG. 7 is a cross-sectional view along A1-A2 of a conductive structure 160 of FIG. 6-2 or 6-3. Looking down onto substrate 30, an interconnect 40 may have a portion of an upper surface thereof associated with a corresponding surface area of an interconnect 50, as indicated with a dashed rounded corner square. Even though a rounded corner square is illustratively depicted, interconnects 40 and/or 50 may use this or another shape, such as rectangles, circles, and/or ellipses, among others.

Outwardly around a sidewall perimeter of interconnect 40 may optionally be barrier layer 116. Outwardly around a sidewall perimeter of interconnect 40, or optional barrier layer 116, may be collar 102. Lastly, outwardly around a sidewall perimeter of collar 102 may be resin layer 101 to provide a hermetic seal. It should be understood that although a hermetic seal is desired, such a hermetic seal may not be achieved in every instance. However, even a partial seal with resin layer 101 may enhance reliability. In some implementations, a seal or resin layer 101 may include a conductive material with a corrosion resistant surface.

FIGS. 8-1 and 8-2 is a hybrid flow-block diagram depicting yet another exemplary process flow 140 for formation of microelectronic devices 100 of FIGS. 2 through 5. With simultaneous reference to FIGS. 1 through 8-2, yet such other process flow 140 is further described. Again, process flow 140 may be for WLP using an in-process wafer 120 including substrate 20 and an in-process wafer 130 including substrate 30.

As much of the description of process flow 140 for FIGS. 8-1 and 8-2 is the same for process flow 140 of FIGS. 6-1 and 6-2, generally only the differences are described below for purposes of clarity and not limitation. Along those lines, operations 141 and 142 are as previously described and thus description of same is not repeated. However, in process flow 140 of FIGS. 8-1 and 8-2, operations 143 and 144 are not performed, leaving surfaces 41 and 51 of interconnects 40 and 50, respectively, covered with layers 131 and 121, respectively.

Figure 81:
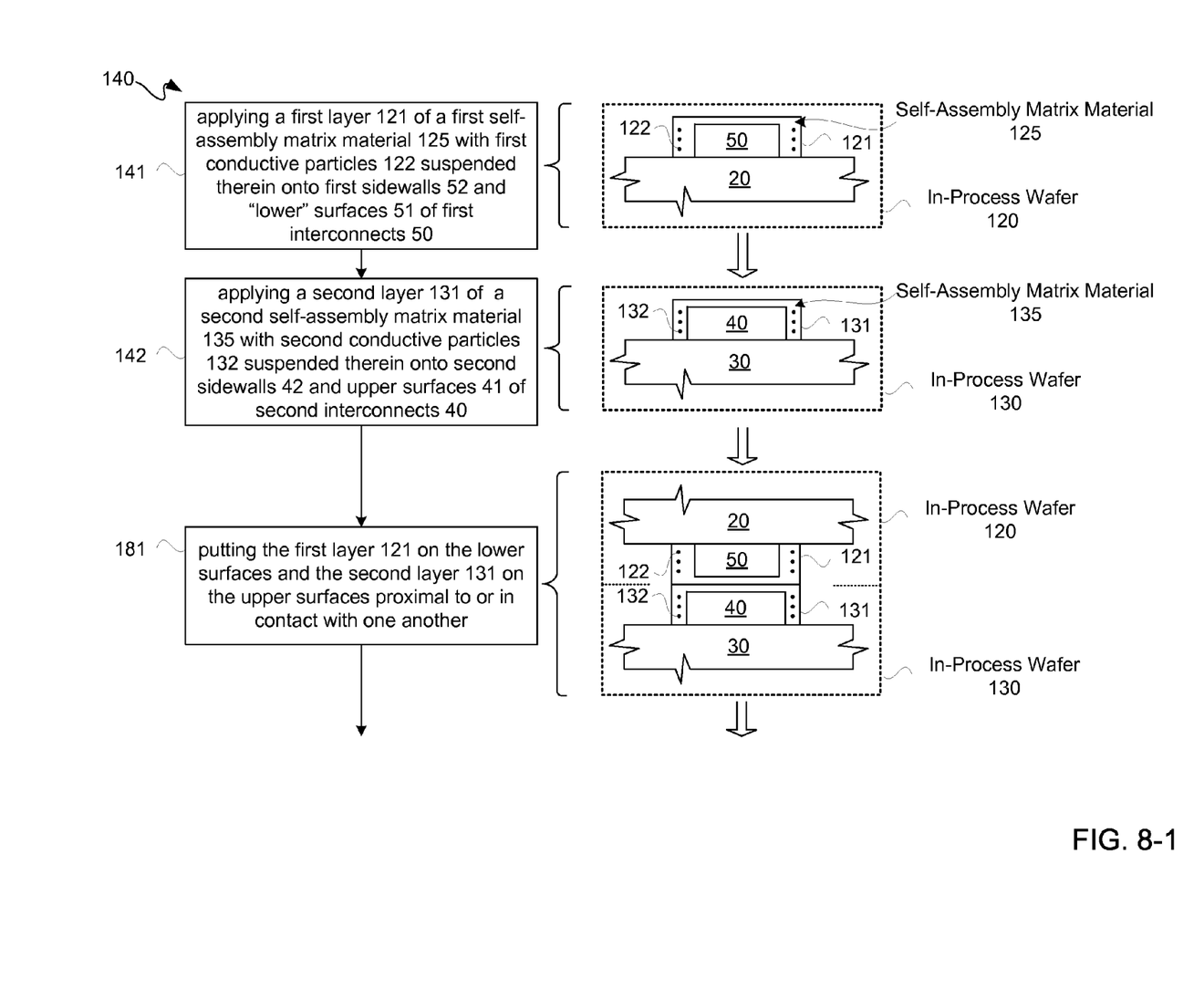

At 181, a surface of first layer 121 on lower surfaces 51 and a surface of second layer 131 on upper surfaces 41 are brought or put proximal to or in contact with one another.

Figure 82:
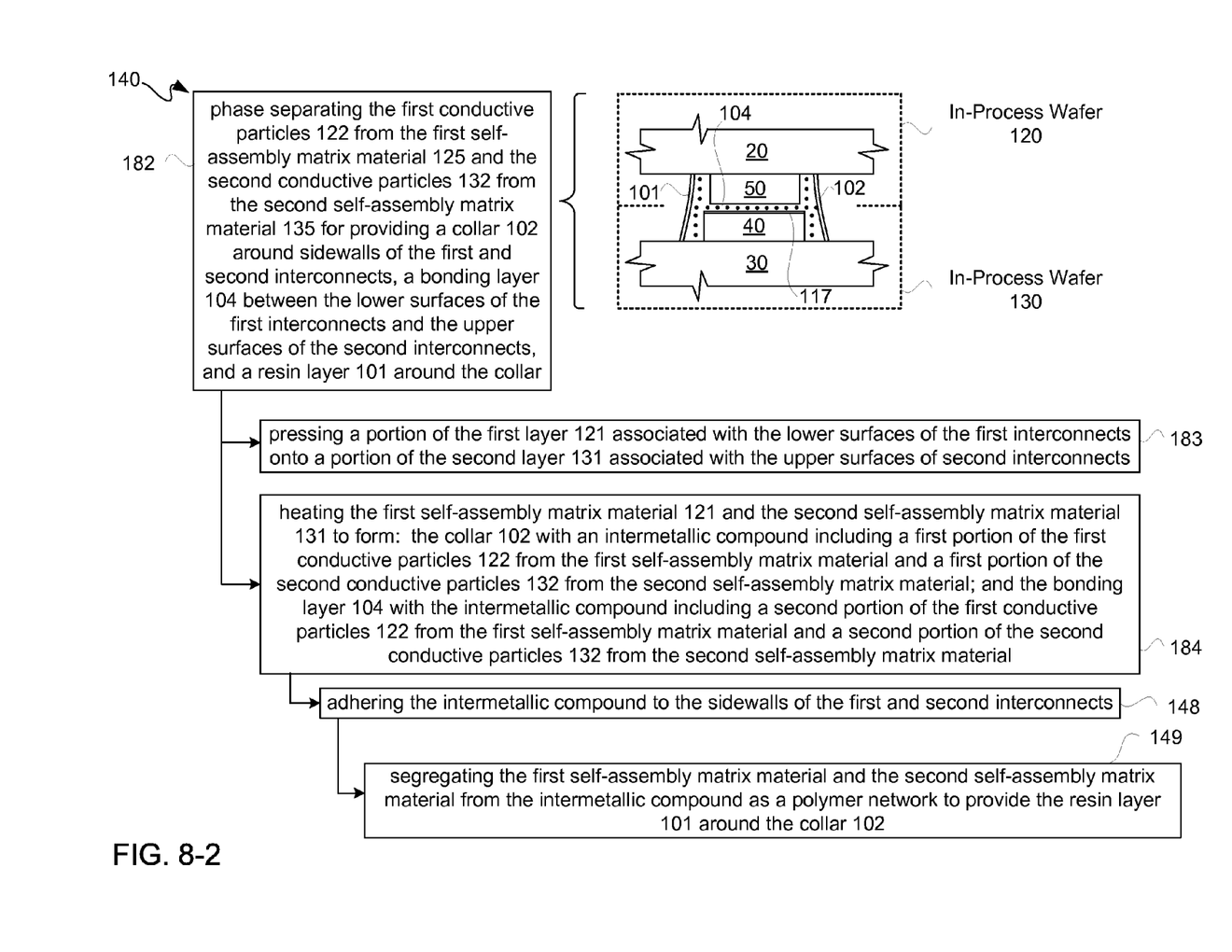

At 182, first conductive particles 122 from first self-assembly matrix material 125 and second conductive particles 132 from second self-assembly matrix material 135 may be phase separated from one another for providing a collar 102 around sidewalls 42 and 52 of first and second interconnects, and a bonding layer 104 between lower surfaces 51 of first interconnects 50 and upper surfaces 41 of second interconnects 40. Such phase separation at 182 may further be for providing a resin layer 101 around collar 102, as previously described.

Phase separation at 182 may include operations of pressing at 183 and heating at 184, as well as self-assembly or self-alignment operations at 148 and 149 resulting from heating of such self-assembly matrix materials 125 and 135 as previously described. At 183, a surface area portion of first layer 121 associated in part with lower surfaces 51 of first interconnects 50 may be pressed onto a surface area portion of second layer 131 associated with upper surfaces 41 of second interconnects 40. This pressing may effectively force out some material of layers 121 and 131 from between surfaces 41 and 51.

Heating at 184 of first self-assembly matrix material 125 and second self-assembly matrix material 135 may form collar 102 with an IMC, such as Cu3Sn in this example, where collar 102 includes a first portion of first conductive particles 122 from first self-assembly matrix material 125 and a first portion of second conductive particles 132 from second self-assembly matrix material 135 in such IMC. This heating at 184 may be a post-reflow operation, where effectively solder from first self-assembly matrix material 125 and second self-assembly matrix material 135 wets surfaces 41, 42, 51, and 52, as well as optionally 43.

Furthermore, heating at 184 of first self-assembly matrix material 125 and second self-assembly matrix material 135 may form bonding layer 104 with such IMC including a second portion of first conductive particles 122 from first self-assembly matrix material 125 and a second portion of second conductive particles 132 from second self-assembly matrix material 135. In this implementation, as no optional Cu-to-Cu diffusion bonding layer is formed as previously described, a reflow joint with a thin Sn cap 117 on top of surfaces 41 may be formed, where generally all remaining Sn is consumed to form a Cu3Sn IMC collar 102.

At 148, such IMC of collar 102 may adhere to sidewalls 42 and 52 of interconnects 40 and 50, as well as to perimeter portions 43 of upper surfaces 41. Generally, a thin and stable layer of Cu—Sn IMC may form on such sidewalls 442 and 52 to provide collar 102. Additionally, collar 102 may include formation of such IMC between interconnects 40 and 50. Along those lines, a portion of the copper of diffusion bonding layer 103 may be consumed in the formation of such IMC. Additionally, a portion of the copper associated with perimeter portions 43 may be consumed in the formation of such IMC. In an implementation, all Sn may be consumed in such formation of a Cu3Sn IMC collar 102. However, generally a Cu3Sn IMC may be formed for collar 102 adhering to and extending outwardly, such as radially, away from sidewalls 42 and 52.

Again, resin layer 101, in addition to adhering to collar 102, may further adhere to surfaces of substrates 20 and 30, to encapsulate conductive structures 160 to provide a protective layer for corrodible components of such conductive structures 160. Accordingly, as surfaces of substrates 20 and 30 may be spaced apart from one another with a less than approximately a 5 micron gap therebetween due to conductive structures 160, resin layers 101 may provide hermetic seals for conductive structures 160 without having to apply an underfill layer. In some implementations this gap between surfaces of substrates 20 and 30 may be equal to or smaller than a pitch between at least two adjacent conductive structures 160 formed to include interconnects 40 and 50. In some other implementations, such gap between such surfaces of substrates 20 and 30 may be equal to or greater than a pitch between at least two adjacent conductive structures 160 formed to include interconnects 40 and 50.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic device, comprising:
   a first substrate having a first surface;
   first interconnects located on the first surface;
   a second substrate having a second surface spaced apart from the first surface with a gap between the first surface and the second surface;
   second interconnects located on the second surface;
   lower surfaces of the first interconnects and upper surfaces of the second interconnects being coupled to one another for electrical conductivity between the first substrate and the second substrate;
   a conductive collar around sidewalls of the first and second interconnects; and
   a dielectric layer around the conductive collar.

2. The microelectronic device according to claim 1, wherein:
   the first and second interconnects respectively include metalization structure; and
   the gap is approximately 5 microns or less.

3. The microelectronic device according to claim 1, wherein:
   the first and second interconnects respectively include metalization structures; and
   the gap is equal to or less than a pitch between at least two adjacent conductive structures having the first interconnects and the second interconnects corresponding thereto coupled to one another for the electrical conductivity between the first substrate and the second substrate.

4. The microelectronic device according to claim 1, wherein:
   the first and second interconnects respectively include metalization structures; and
   the gap is equal to or greater than a pitch between at least two adjacent conductive structures having the first interconnects and the second interconnects corresponding thereto coupled to one another for the electrical conductivity between the first substrate and the second substrate.

5. The microelectronic device according to claim 1, wherein the dielectric layer adheres to the first surface, the second surface and the conductive collar for hermetic sealing of the conductive collar, the first interconnects and the second interconnects between the first surface and the second surface.

6. The microelectronic device according to claim 1, further comprising:
   a diffusion bonding layer between the first and second interconnects;
   wherein the lower surfaces of the first interconnects and the upper surfaces of the second interconnects are coupled to one another for electrical conductivity by the diffusion bonding layer.

7. The microelectronic device according to claim 1, further comprising:
   an intermetallic compound layer between the first and second interconnects;
   the lower surfaces of the first interconnects and the upper surfaces of the second interconnects being coupled to one another for electrical conductivity with the intermetallic compound layer.

8. The microelectronic device according to claim 1, wherein the conductive collar includes an intermetallic compound.

9. The microelectronic device according to claim 7, wherein the intermetallic compound of the conductive collar is around the sidewalls of the first and second interconnects.

10. The microelectronic device according to claim 1, further comprising a diffusion barrier layer between the sidewalls of the first and second interconnects and the conductive collar.

11. The microelectronic device according to claim 1, wherein the first substrate and the second substrate either respectively include a semiconductor die and an interposer or a first semiconductor die and a second semiconductor die.

12. A method for forming a microelectronic device, comprising:
   applying a first layer of a first self-assembly matrix material with first conductive particles suspended therein onto first sidewalls and lower surfaces of first interconnects;
   the first interconnects being on a first surface of a first substrate;
   applying a second layer of a second self-assembly matrix material with second conductive particles suspended therein onto second sidewalls and upper surfaces of second interconnects;
   the second interconnects being on a second surface of a second substrate;
   removing a portion of the first layer for temporarily exposing the lower surfaces of the first interconnects;
   removing a portion of the second layer for temporarily exposing the upper surfaces of the second interconnects; and phase separating the first conductive particles from the first self-assembly matrix material and the second conductive particles from the second self-assembly matrix material for providing a conductive collar around sidewalls of the first and second interconnects and a dielectric layer around the conductive collar;

wherein the second surface is spaced apart from the first surface with approximately a 5 or less micron gap therebetween for the first and second interconnects diffusion bonded to one another.

13. The method according to claim 12, further comprising diffusion bonding the lower surfaces of the first interconnects and the upper surfaces of the second interconnects one to another for electrical conductivity between the first substrate and the second substrate prior to the phase separating.

14. The method according to claim 13, wherein the diffusion bonding of the lower surfaces of the first interconnects and the upper surfaces of the second interconnects one to another includes forming a diffusion bonding layer between the lower surfaces and the upper surfaces corresponding thereto.

15. The method according to claim 12, wherein the phase separating comprises:
heating the first self-assembly matrix material and the second self-assembly matrix material to form the conductive collar with an intermetallic compound including the first conductive particles from the first self-assembly matrix material and the second conductive particles from the second self-assembly matrix material;
self-aligned adhering of the intermetallic compound to the sidewalls of the first and second interconnects; and
self-aligned segregating of the first self-assembly matrix material and the second self-assembly matrix material from the intermetallic compound as a polymer network to provide the dielectric layer around the conductive collar.

16. The method according to claim 12, wherein the phase separating comprises separating the first conductive particles from the first self-assembly matrix material and the second conductive particles from the second self-assembly matrix material for providing a barrier layer around sidewalls of the first and second interconnects, the conductive collar around the barrier layer, and the dielectric layer around the conductive collar.

17. The method according to claim 16, wherein the phase separating comprises:
heating the first self-assembly matrix material and the second self-assembly matrix material to form the barrier layer and the conductive collar;
self-aligned adhering of the barrier layer to the sidewalls of the first and second interconnects;
self-aligned adhering of the conductive collar to side surfaces of the barrier layer; and
self-aligned segregating of the first self-assembly matrix material and the second self-assembly matrix material from the conductive collar as a polymer network to provide the dielectric layer around the conductive collar.

18. The method according to claim 12, wherein:
the removing of the portion of the first layer includes planarizing the lower surfaces for the temporary exposing thereof; and
the removing of the portion of the second layer includes planarizing the upper surfaces for the temporary exposing thereof.

19. A method for forming a microelectronic device, comprising:
applying a first layer of a first self-assembly matrix material with first conductive particles suspended therein onto first sidewalls and lower surfaces of first interconnects;
the first interconnects being on a first surface of a first substrate;
applying a second layer of a second self-assembly matrix material with second conductive particles suspended therein onto second sidewalls and upper surfaces of second interconnects;
the second interconnects being on a second surface of a second substrate;
putting the first layer on the lower surfaces and the second layer on the upper surfaces proximal to or in contact with one another;
phase separating the first conductive particles from the first self-assembly matrix material and the second conductive particles from the second self-assembly matrix material for providing a conductive collar around sidewalls of the first and second interconnects, a bonding layer between the lower surfaces of the first interconnects and the upper surfaces of the second interconnects, and a dielectric layer around the conductive collar;
wherein the second surface is spaced apart from the first surface with approximately a 5 or less micron gap therebetween for the first and second interconnects intermetallic bonded to one another.

20. The method according to claim 19, wherein the phase separating comprises:
pressing a portion of the first layer associated with the lower surfaces of the first interconnects onto a portion of the second layer associated with the upper surfaces of second interconnects;
heating the first self-assembly matrix material and the second self-assembly matrix material to form:
the conductive collar with an intermetallic compound including a first portion of the first conductive particles from the first self-assembly matrix material and a first portion of the second conductive particles from the second self-assembly matrix material; and
the bonding layer with the intermetallic compound including a second portion of the first conductive particles from the first self-assembly matrix material and a second portion of the second conductive particles from the second self-assembly matrix material;
self-aligned adhering of the intermetallic compound to the sidewalls of the first and second interconnects; and
self-aligned segregating of the first self-assembly matrix material and the second self-assembly matrix material from the intermetallic compound as a polymer network to provide the dielectric layer around the conductive collar.

* * * * *